United States Patent [19]
Godshalk et al.

[11] Patent Number: 5,506,515
[45] Date of Patent: Apr. 9, 1996

[54] HIGH-FREQUENCY PROBE TIP ASSEMBLY

[75] Inventors: Edward M. Godshalk; Jeffrey A. Williams, both of Beaverton; Jeremy N. Burr, Portland, all of Oreg.

[73] Assignee: Cascade Microtech, Inc., Beaverton, Oreg.

[21] Appl. No.: 277,835

[22] Filed: Jul. 20, 1994

[51] Int. Cl.⁶ .................................................. G01R 31/02
[52] U.S. Cl. ........................................... 324/762; 324/754
[58] Field of Search ....................................... 324/754, 762

[56] References Cited

U.S. PATENT DOCUMENTS 5,373,231  12/1994  Boll et al. ............................ 324/158.1

FOREIGN PATENT DOCUMENTS 0259183  3/1988  European Pat. Off. .

*Primary Examiner*—Kenneth A. Wieder
*Assistant Examiner*—Kourosh Cyrus Khosravi
*Attorney, Agent, or Firm*—Chernoff, Vilhauer, McClung & Stenzel

[57] ABSTRACT

A probe suitable for low-loss microwave frequency operation has a tip assembly including a semi-rigid coaxial cable having a Teflon™ dielectric for temperature stability and a freely-suspended end. On this end a semicylindrical recess is formed defining a shelf along which an inner finger and outer pair of fingers are mounted, each made of resilient conductive material, so as to form a coplanar transmission line. Cantilevered portions of the fingers extend past the end of the cable to form an air-dielectric transmission path of uniform and stable characteristic despite exposure to numerous contact cycles and to provide suitable means for probing nonplanar device pads while also offering good visibility of device pads generally. Corresponding sections of the cantilevered portions are equivalently configured in terms of material composition, cross-sectional geometry and spatial orientation to provide a uniform deflection characteristic relative to each finger for even wearing of the pads and fingers and for stability of transmission characteristic despite contact pressure variation. A rearwardly-inclining end face on each finger reflects dark background shading to cause a dark line to form on each extreme finger end in sharp contrast to the device pads thus facilitating finger visibility. The fingers are originally formed in one-piece and are joined by a carrier strip which is trimmed off after the fingers are connected to the cable so that their transverse spacing is precisely determined.

15 Claims, 4 Drawing Sheets

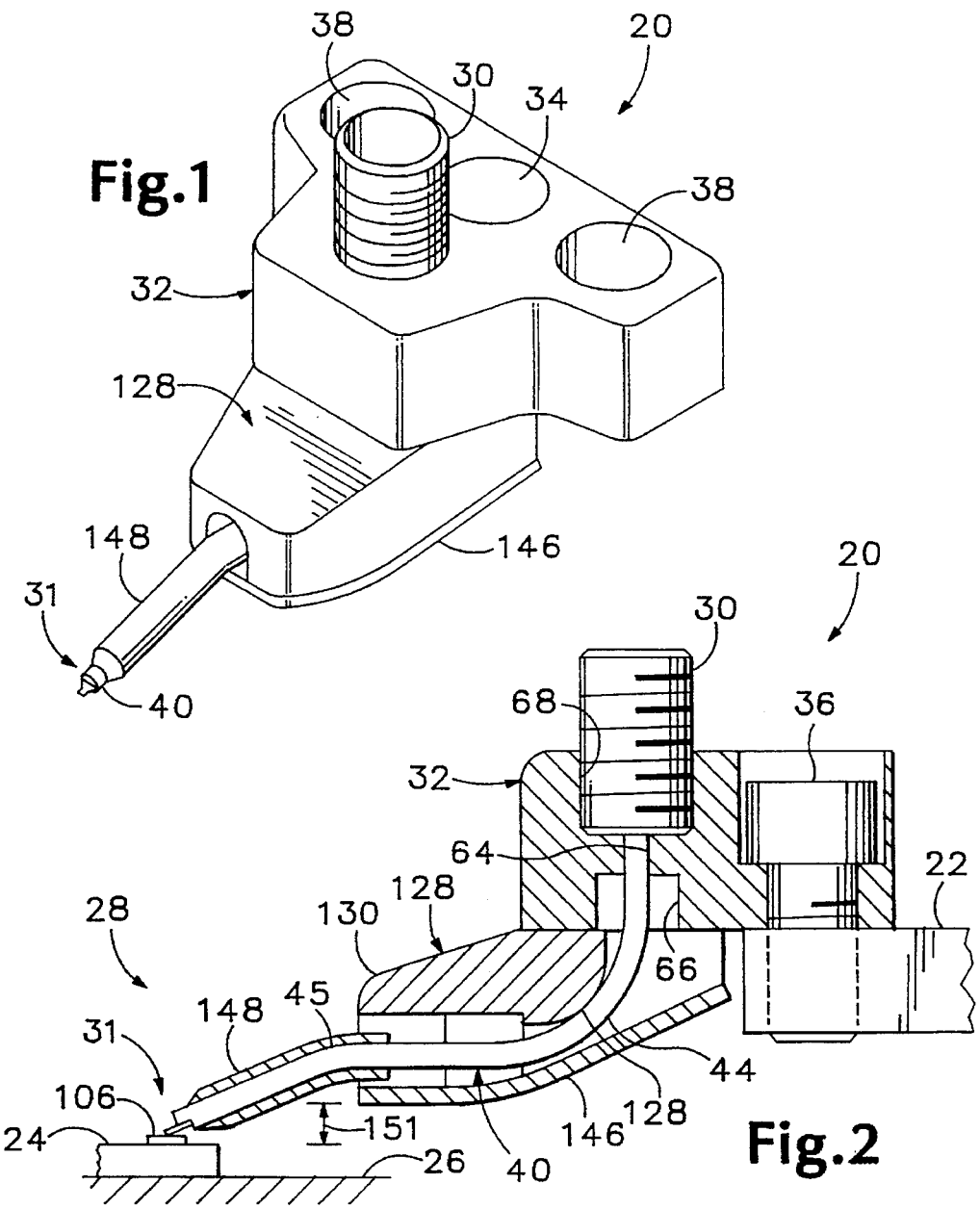
Fig.1
Fig.2
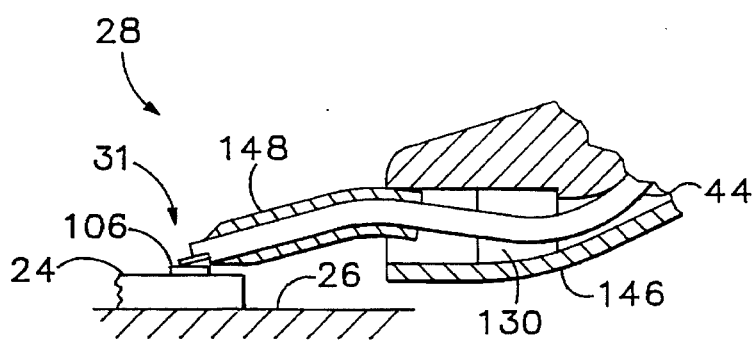
Fig.3

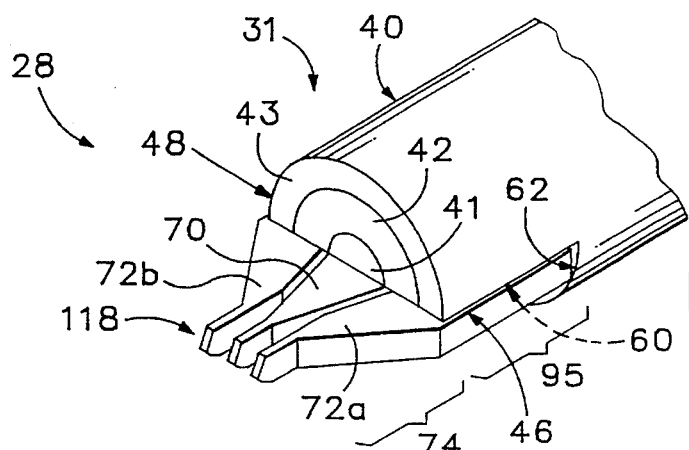
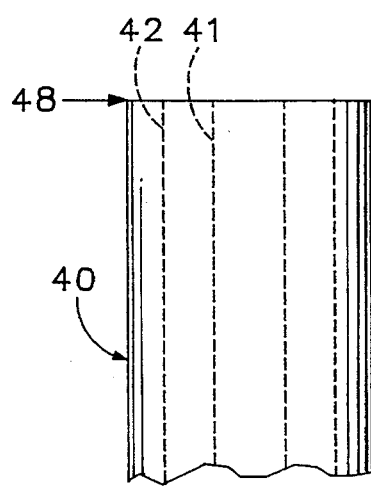
Fig.5a
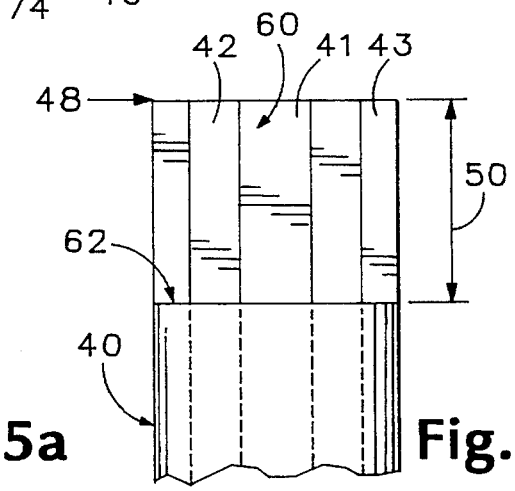
Fig.5b
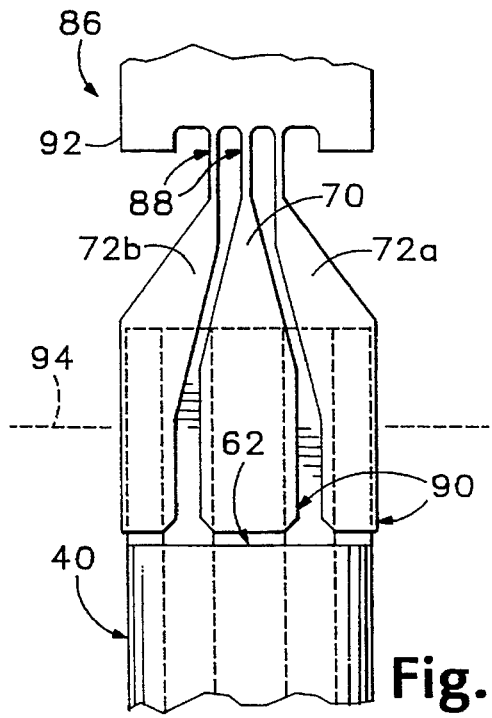
Fig.5c
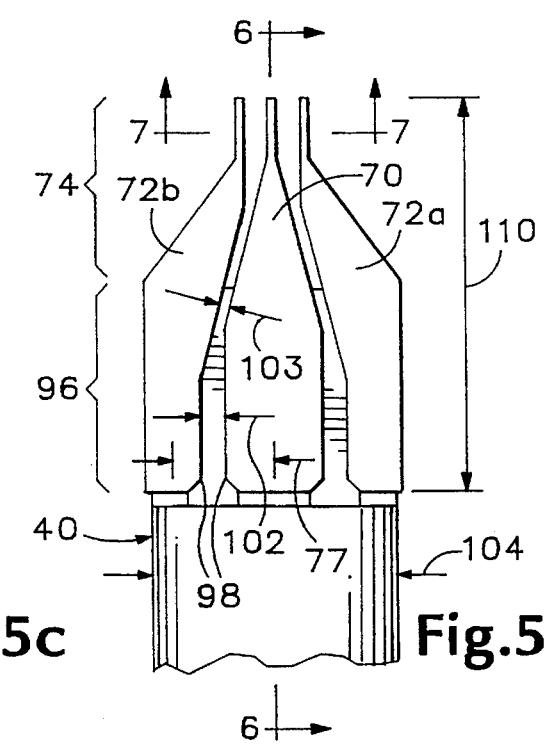
Fig.5d
Fig.4

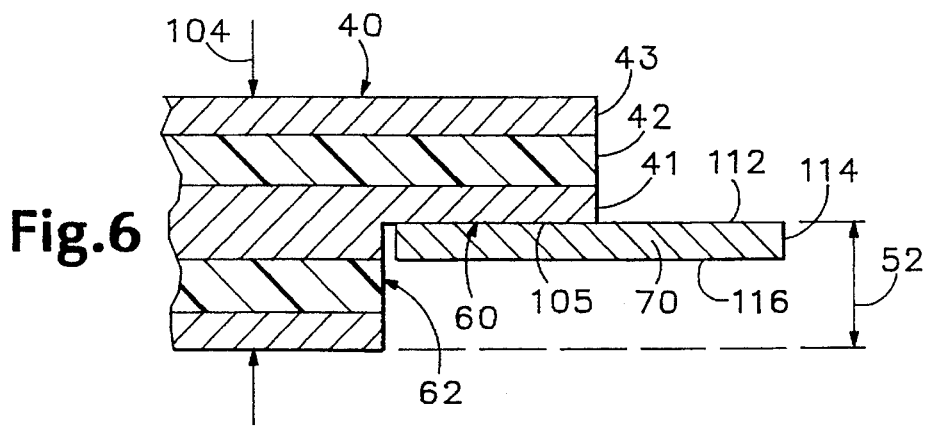
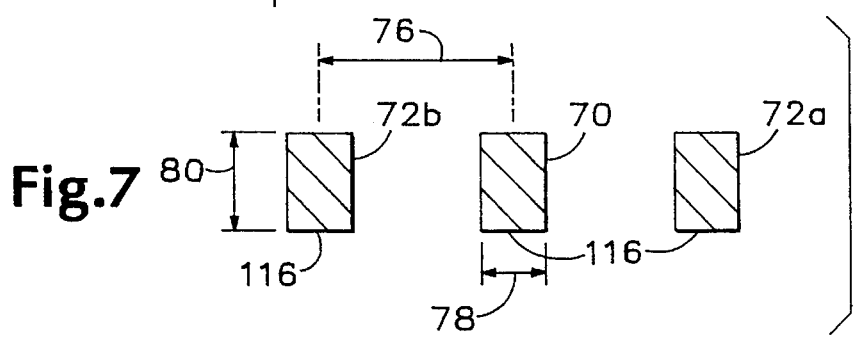
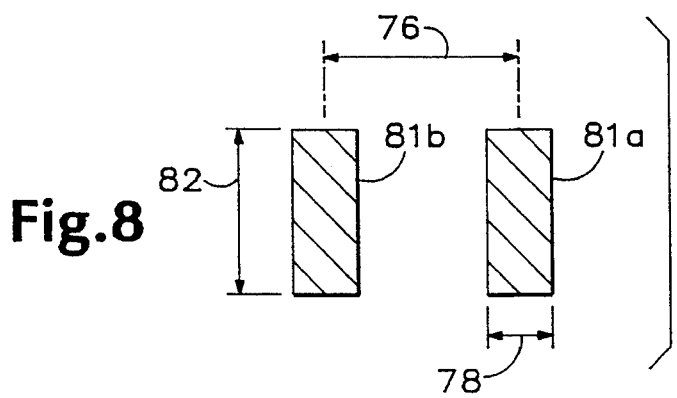
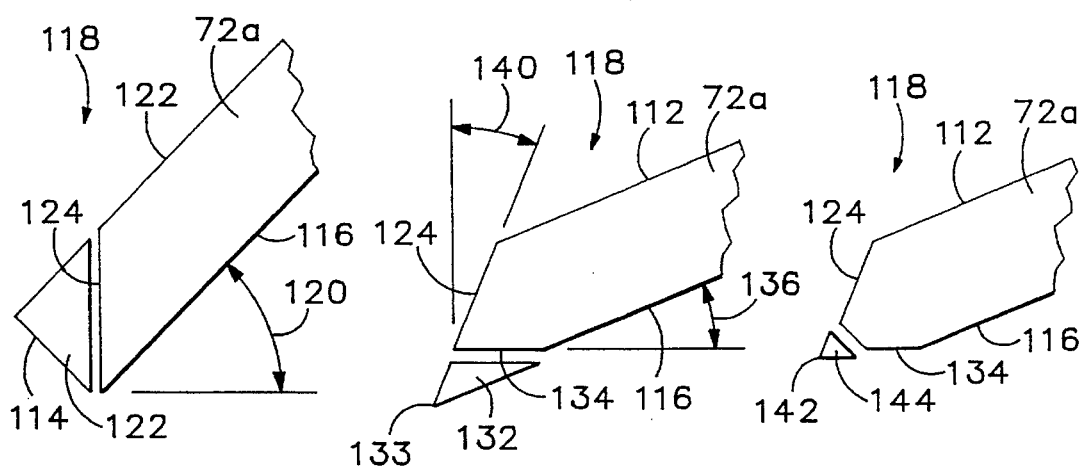

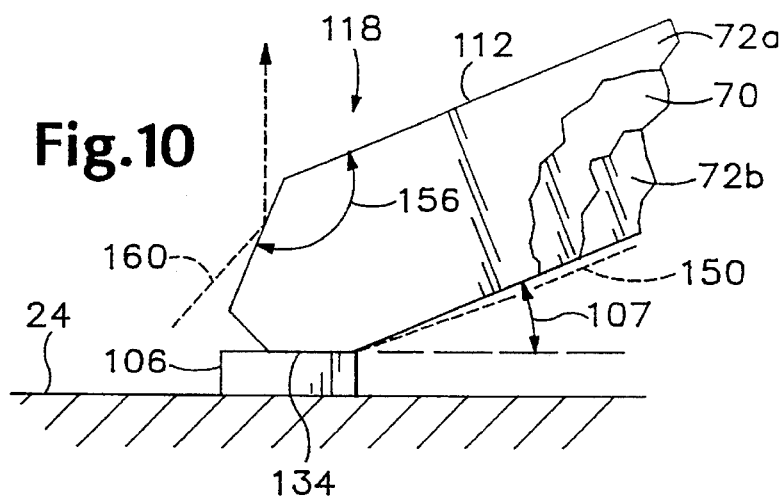
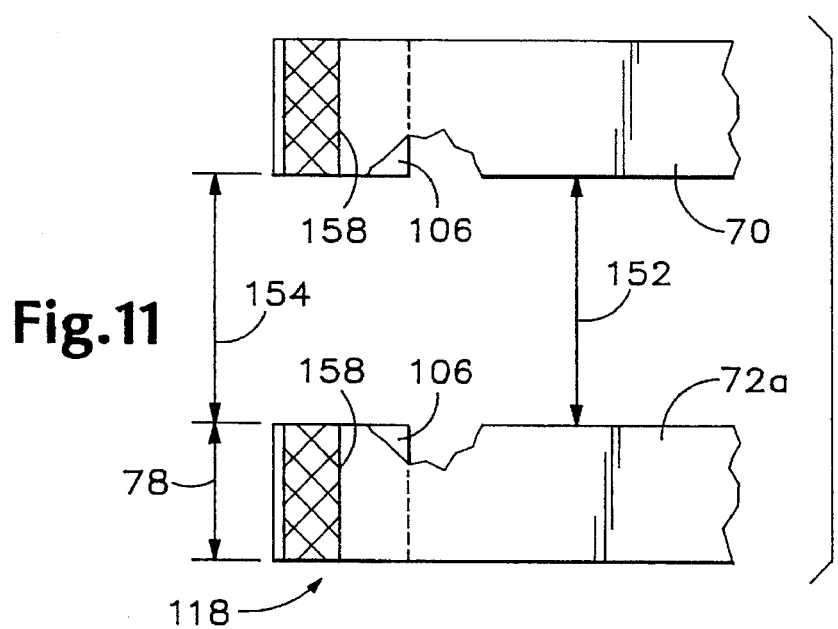
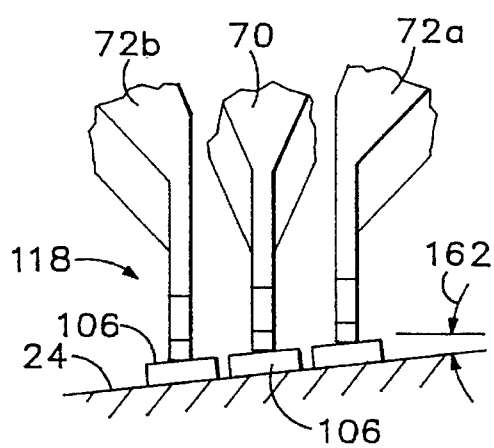
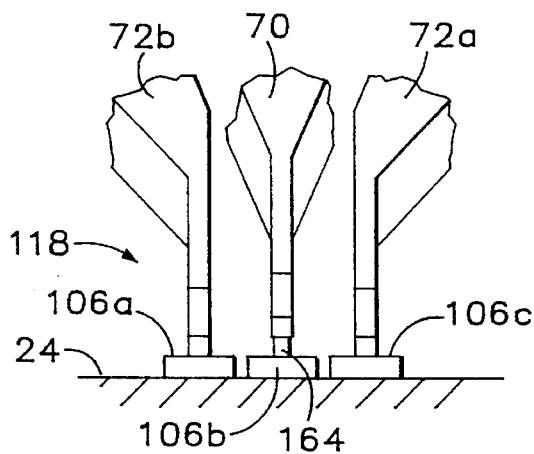

HIGH-FREQUENCY PROBE TIP ASSEMBLY

BACKGROUND OF THE INVENTION

The present invention relates to probe measurement systems for measuring the electrical characteristics of integrated circuits or other microelectronic devices at high frequencies that extend into the gigahertz range.

There are many types of probing assemblies that have been developed for the measurement of integrated circuits and other forms of microelectronic devices. One representative type of assembly uses a circuit card on which are formed elongate conductive traces that serve as signal and ground lines. A central opening is formed in the card, and a needle-like probe tip is attached to the end of each trace adjacent the opening so that a radially extending array of downwardly converging needle-like tips is presented by the assembly for selective connection with the closely spaced pads of the microelectronic device being tested. A probe assembly of this type is shown, for example, in Harmon U.S. Pat. No. 3,445,770. This type of probing assembly, however, is unsuitable for use at higher frequencies, including microwave frequencies in the gigahertz range, because at such frequencies the needle-like tips act as inductive elements and because there are no adjoining elements present to suitably counteract this inductance with a capacitive effect in a manner that would create a broadband characteristic of more or less resistive effect. Accordingly, a probing assembly of the type just described is unsuitable for use at microwave frequencies due to the high levels of signal reflection and substantial inductive losses that occur at the needle-like probe tips.

In order to obtain device measurements at somewhat higher frequencies than are possible with the basic system just described, various related probing systems have been developed. Such systems are shown, for example, in Evans U.S. Pat. No. 3,849,728, Kikuchi Japanese Publication No. 1-209,380, Sang et al. U.S. Pat. No. 4,749,942, Lao et al. U.S. Pat. No. 4,593,243, and Shahriary U.S. Pat. No. 4,727,319. Yet another related system is shown in Kawanabe Japanese Publication No. 60-223,138 which describes a probe assembly having needle-like tips where the tips extend from a coaxial cable-like structure instead of a probe card. A common feature of each of these more recent systems is that the length of the isolated portion of each needle-like probe tip is limited to the region immediately surrounding the device-under-test in order to minimize the region of discontinuity and the amount of inductive loss. However, this approach has resulted in only limited improvement in higher frequency performance due to various practical limitations in the construction of these types of probes. In Lao et al., for example, the length of each needle-like tip is minimized by using a wide conductive blade to span the distance between each tip and the supporting probe card, and these blades, in turn, are designed to be arranged relative to each other so as to form transmission line structures of stripline type. As a practical matter, however, it is difficult to join the thin vertical edge of each blade to the corresponding trace on the card while maintaining precisely the appropriate amount of face-to-face spacing between the blades and precisely the correct pitch between the ends of the needle-like probe tips.

One type of probing assembly that is capable of providing a controlled-impedance low-loss path between its input terminal and the probe tips is shown in Lockwood et al. U.S. Pat. No. 4,697,143. In Lockwood et al., a ground-signal-ground arrangement of strip-like conductive traces is formed on the underside of an alumina substrate so as to form a coplanar transmission line on the substrate. At one end, each associated pair of ground traces and the corresponding interposed signal trace are connected to the outer conductor and the center conductor, respectively, of a coaxial cable connector. At the other end of these traces, areas of wear-resistant conductive material are provided in order to reliably establish electrical connection with the respective pads of the device to be tested. Layers of ferrite-containing microwave absorbing material are mounted about the substrate to absorb spurious microwave energy over a major portion of the length of each ground-signal-ground trace pattern. In accordance with this type of construction, a controlled high-frequency impedance (e.g., 50 ohms) can be presented at the probe tips to the device under test, and broadband signals that are within the range, for example, of DC to 18 gigahertz can travel with little loss from one end of the probe assembly to another along the coplanar transmission line formed by each ground-signal-ground trace pattern.

Although the probing assembly shown in Lockwood et al. provides satisfactory electrical performance at microwave frequencies, in the intervening period of time since this probe was first introduced, there has been a shift in emphasis in microwave probing technology toward high-volume production-oriented measurements. In accordance with this shift, there has been increasing demand for a probing assembly that can be rapidly positioned accurately on the closely-spaced contact pads of a microelectronic device and that, at the same time, is sufficiently rugged to withstand repeated use in a high-volume production environment without undue wear or component failure. With respect to the Lockwood et al. probing assembly, however, the opacity of the substrate tends to contribute to delay in the positioning process since the operator's view of the contact pads on the device is obscured at least part of the time by the substrate as the operator shifts the substrate back-and-forth over the pads while attempting to align the contacting areas on the substrate's underside with the pads. There has also been increasing demand for a probing assembly that has the capacity to probe non-planar as well as planar surfaces. This feature not only enables the measurement of such devices as multi-chip modules (MCMs), fired ceramic substrates, and flip-chips, but can also compensate for nonideal measurement conditions such as can occur, for example, when the device pads differ in height or when a loose metallic particle of minute dimension adheres electrostatically to the surface of one of the pads of the device-under-test so as to form a non-planar surface irregularity or when the plane of the device-under-test is inadvertently tilted at a slight angle in relation to the plane of the coplanar tips of the probing assembly. There is no specific mechanism on the Lockwood et al. probing assembly, however, that would enable the contacting areas on the substrate's underside to spatially conform to a non-planar arrangement of pads or other contact surfaces.

To achieve improved spatial conformance between the tip conductors of a probe and an array of non-planar device pads or surfaces, alternative high-frequency probing assemblies have been developed. Such assemblies are described, for example, in Drake et al. U.S. Pat. No. 4,894,612, Coberly et al. U.S. Pat. No. 4,116,523 and Boll et al. U.S. Pat. No. 4,871,964. As in Lockwood et al., the Drake et al. probing assembly includes a substrate on the underside of which are formed a plurality of conductive traces which collectively form a coplanar transmission line. However, in one embodiment shown in Drake et al., the tip end of the substrate is notched so that each trace extends to the end of a separate tooth and the substrate is made of moderately flexible nonceramic material. The notches between the teeth provide a marginal degree of improvement in the visibility of the device pads during positioning of the probe tip, and the moderately flexible substrate permits, at least to a limited extent, independent flexure of each tooth relative to the other teeth so as to enable spatial conformance of the trace ends to slightly non-planar contact surfaces on a device-under-test. However, the Drake et al. probing assembly is of insufficiently rugged design to be satisfactory for use in high-volume production-oriented environments. Repeated flexing of the substrate teeth, for example, fatigues the supporting substrate and causes minute dislocations to gradually form within the substrate material. This eventually leads to significant degradation in the high-frequency performance of the Drake et al. assembly. Likewise, the probing assembly shown in Coberly et al. is ultimately susceptible to significant performance degradation due to the gradual formation of dislocations in the Mylar™ material that encapsulates the center finger or vertical blade of that particular assembly.

With respect to the probing assembly shown in Boll et al., as cited above, the ground conductors comprise a pair of leaf-spring members the rear portions of which are received into diametrically opposite slots formed on the end of a miniature coaxial cable for electrical connection with the cylindrical outer conductor of that cable. The center conductor of the cable is extended beyond the end of the cable (i.e., as defined by the ends of the outer conductor and the inner dielectric) and is gradually tapered to form a pin-like member having a rounded point. In accordance with this construction, the pin-like extension of the center conductor is disposed in spaced apart generally centered position between the respective forward portions of the leaf-spring members and thereby forms, in combination with these leaf-spring members, a rough approximation to a ground-signal-ground coplanar transmission line structure. The advantage of this particular construction is that the pin-like extension of the cable's center conductor and the respective forward portions of the leaf-spring members are each movable independently of each other so that the ends of these respective members are able to establish spatially conforming contact with any non-planar contact areas on a device being tested. On the other hand, the transverse-spacing between the pin-like member and the respective leaf-spring members will vary depending on how forcefully the ends of these members are urged against the contact pads of the device-under-test. In other words, the transmission characteristic of this probing structure, which is dependent on the spacing between the respective tip members, will vary in an ill-defined manner during each probing cycle.

Another difficulty with the Boll et al. probing structure is that the pin-like member and the leaf-spring members develop quite different levels of contact force when pressed against the corresponding contact pads of the device being tested. This nonuniformity of contact force can cause uneven wearing of the pads and the probing members or even more substantial damage. In order to partially alleviate this problem, a downwardly curving bend is formed in each of the probing members, and the leaf-spring members, in particular, are so arranged that their respective ends extend to a lower plane than the end of the pin-like member. Accordingly, the more flexible leaf-spring members are able to develop a moderate level of contact pressure against the corresponding pads on the device before the stiffer pin-like member engages its corresponding pad. However, the respective amounts of contact force exerted by the pin-like member and the leaf-spring members are still likely to differ significantly from each other since no mechanism is provided for deflecting each member by a set amount during each probing cycle.

In accordance with the foregoing, then, an object of the present invention is to provide an improved probing assembly that is operable at microwave frequencies extending into the gigahertz range and that is capable of providing, at such frequencies, a transmission channel of well-defined impedance for low-loss transfer of signals to and from the contact pads of a device-under-test.

A related object of the present invention is to provide a probing assembly of the above general type that can be used to probe non-planar surfaces with minimal degradation of electrical performance.

Another related object of the present invention is to provide a probing assembly of the above general type that affords good visibility of the closely-spaced contact pads of a device-under-test so that the tips of the assembly can be rapidly positioned accurately on such pads.

Yet another related object of the present invention is to provide a probing assembly of the above general type that is sufficiently rugged to withstand repeated use in a high-volume production environment without undue performance degradation or component failure.

SUMMARY OF THE INVENTION

To achieve the above objectives, in accordance with a first aspect of the present invention, a probe tip assembly is provided having respective first and second resilient conductive fingers that are connected to the inner conductor and outer conductor, respectively, of a coaxial cable. Each finger includes a cantilevered portion extending past the end of the cable and the cantilevered portions of the fingers are arranged in transversely spaced apart relationship to each other so as to cooperatively form a controlled impedance transmission line. The cantilevered portion of each finger is self-supporting in a manner substantially unsupported by any dielectric material, and a contacting member on each cantilevered portion is suitably disposed for selective pressing engagement against a corresponding contact pad of a device-under-test. In addition, these contacting members are arranged in mutually coplanar relationship with each other in the absence of any external forces acting on the fingers.

In accordance with the above construction, the coaxial cable and the fingers cooperatively provide a high-frequency transmission line suitable for operation at microwave frequencies where the air gap between the cantilevered portions of the fingers, in particular, effectively serves as a low loss dielectric along the section of the transmission line that includes these portions. The compliancy of each resilient finger affords maximum flexibility in terms of the capacity of the assembly to probe non-planar device pads or surfaces. The lack of supporting dielectric material about the cantilevered portion of each finger affords the operator good visibility of the device pads through the gaps between the fingers. It also avoids the degradation in electrical performance that results when a dielectric support is used in a manner that exposes the support to repeated flexing over numerous contact cycles so as to cause material fatigue within the dielectric. Arrangement of the contacting members of the fingers in such a manner that these members are substantially coplanar with each other in the absence of external forces acting on the fingers is consistent with the broader design objective of arranging the fingers so that each is oriented in like spatial relationship with respect to the corresponding pad of the device-under-test. Provided also that the fingers have like material and geometrical properties, this ensures substantial uniformity in deflection rates between the fingers. Thus a controlled impedance is maintained between the fingers regardless of the amount of finger deflection occurring in a particular contact cycle, and also there is no opportunity for a significant imbalance in contact pressure to develop between the different contacting members. This, in turn, prevents excessive wearing of the probe tips and pads so that the probe assembly is well-suited for use in high-volume production-oriented environments.

In accordance with a second aspect of the present invention, a probe tip assembly is provided which includes first and second conductive fingers connected to the inner conductor and outer conductor, respectively, of a coaxial cable. Each finger includes a cantilevered portion extending past the end of the cable and these portions are arranged in transversely spaced relationship to each other. A semicylindrical recess is formed on the cable adjacent the end so as to provide a flat shelf on the cable extending to the end, and each finger includes a supported portion connected along this flat shelf.

In accordance with this second aspect of the invention, face-to-face connection of each finger to the corresponding conductor is possible. This facilitates later rework of the fingers and the convenient replacement of one set of fingers for another should the first set become damaged for any reason. This also establishes a rugged and reliable connection joint between each finger and the cable so that the resulting tip assembly is suitable for use in high-volume production-oriented applications. At the same time, use of a flat shelf on the cable allows each conductor on the cable to be connected in similar fashion to its corresponding finger, so that fingers of like material and geometrical properties can be used in order to obtain uniform deflection rates during each contact cycle. This results in even wearing of the contacting members on the fingers and the maintenance of a substantially constant impedance between corresponding sections of the fingers due to uniform deflection of the fingers at any given contact pressure.

In accordance with a third aspect of the present invention, a method of making a probe tip assembly is provided. This method includes providing a coaxial cable as well as a conductive member, where the conductive member has first and second fingers, each having opposite first and second end portions, and the fingers are integrally interconnected together adjacent their first end portions by a carrier strip included on the member so that a predetermined transverse spacing is established between the fingers. The method further includes connecting the second end portions of the fingers to the cable so that the first and second fingers are electrically connected to the inner and outer conductors, respectively, of the cable, while maintaining the predetermined transverse spacing between the fingers by means of the carrier strip. The method thereafter includes removing the carrier strip so as to electrically isolate the first and second fingers from each other.

In accordance with this third aspect of the present invention, the transverse spacing between the fingers as existing after connection of the fingers to the cable is able to be precisely controlled. This, in turn, enables precise control of the transmission characteristic of the transmission line structure formed by the fingers so that a low loss transition can be made to the pads of the device being tested.

The foregoing and other objectives, features, and advantages of the invention will be more readily understood upon consideration of the following detailed description of the invention, taken in conjunction with the accompanying drawings.

BRIEF DESCRIPTION OF THE DRAWINGS

FIG. 1 is a perspective view of an exemplary wafer probe constructed in accordance with the present invention.

FIG. 2 is a longitudinal sectional view of the wafer probe of FIG. 1 as mounted on a probe-supporting member and just after contact has been made between the probing end of the probe and a device-under-test.

FIG. 3 is a fragmentary view corresponding to FIG. 2 except showing how the tip assembly of the probe moves in relation to the main body of the probe in response to a downward shift by such main body in relation to the device-under-test.

FIG. 4 is an enlarged perspective view of the probing end of the wafer probe of FIG. 1 before assembly of this end has been completed by the installation of a tube absorber about a cable included on the end.

FIGS. 5a–5d show in bottom elevational view successive steps in the manufacture of the probingsend of FIG. 4.

FIG. 6 is a longitudinal sectional view taken along lines 6—6 in FIG. 5d.

FIG. 7 is a transverse sectional view of the fingers on the probing end as taken along lines 7—7 in FIG. 5d.

FIG. 8 is similar to FIG. 7 except showing an alternative finger arrangement.

FIGS. 9a–9c show in fragmentary side elevational view further sequential processing steps that are performed in accordance with the present invention with respect to the distal end of each finger of FIG. 5d.

FIG. 10 is a fragmentary side elevational view showing how each finger of the probe of FIG. 2 is normally positioned in relation to its corresponding contact pad.

FIG. 11 is a fragmentary plan view corresponding to FIG. 10 that shows the relative position of a pair of fingers and their corresponding contact pads and that further indicates, with crosshatched shading, how a dark line visually appears between the end of each finger and the corresponding pad as seen by an observer looking down at each finger.

FIG. 12 is an end elevational view showing how the fingers of the probe of FIG. 4 flexibly adapt to a non-planar probing condition of the type which is caused by misalignment between the plane of the fingers and the plane of the device-under-test.

FIG. 13 is an end elevational view showing how the fingers of the probe of FIG. 4 flexibly adapt to a non-planar probing condition of the type which is caused by a minute conductive particle that has electrostatically adhered to the center pad of the device-under-test.

DETAILED DESCRIPTION OF THE PREFERRED EMBODIMENTS

FIG. 1 shows an exemplary wafer probe 20 constructed in accordance with the present invention. Referring also to FIG. 2, this probe is designed to be mounted on a probe-supporting member 22 of a wafer probe station so as to be in suitable position for probing a device-under-test, such as an individual component on a wafer 24. In this type of application, the wafer is typically supported under vacuum pressure on the upper surface of a chuck 26 which is part of the same probing station. Ordinarily an X-Y-Z positioning mechanism is provided, such as a micrometer knob assembly, to effect movement between the supporting member and the chuck so that the tip assembly 28 of the wafer probe can be brought into pressing engagement with contact pads 106 on the wafer that correspond to the particular component requiring measurement.

As shown in FIGS. 1–2, the exemplary wafer probe 20 has an input port 30 which, in the preferred embodiment depicted, comprises a spark-plug type, K-connector. This connector enables the external connection of an ordinary coaxial cable to the wafer probe so that a well-shielded high frequency transmission channel can be established between the wafer probe and the measuring instrument. If desired, other types of connectors can be used such as a 2.4 mm connector, a 1.85 mm connector or a 1 mm connector. As will become clearer from the description below, the wafer probe provides a low-loss transmission path of controlled impedance characteristic from its input port 30 down to the probing end 31 of its tip assembly. In tests conducted on an actual unit of like construction to that shown in the drawings, for example, an insertion loss of less than 0.49 dB was measured for operating frequencies up to 40 Ghz. Moreover, the tip assembly 28 of the wafer probe is of particularly rugged construction. In further tests performed on the above-referenced unit, for example, the unit was able to withstand in excess of 500,000 separate contact cycles without maintenance or repair. At the same time, the tip assembly is able to readily adapt to non-planar device surfaces. With respect, for example, to the above-referenced unit, when a surface irregularity of up to 25 microns high was present on one of the device pads or when up to 10 degrees of planar misalignment existed between the tip assembly and the device surface, less than –30 dB error was measured at operating frequencies up to 40 Ghz. The physical basis for these and other advantageous characteristics of the exemplary wafer probe are described in detail in the description below.

With respect to its overall construction, the wafer probe 20 includes a primary support block 32 which, in the preferred embodiment shown, is made of brass and which is suitably constructed for connection to the probe-supporting member 22. To effect this connection, a round opening 34 that is formed on the block is snugly fitted slidably onto an alignment pin (not shown) that upwardly projects from the probe-supporting member, and a pair of fastening screws 36 are inserted into a corresponding pair of countersunk openings 38 provided on the block for screwing engagement with the probe-supporting member, each within a respective threaded opening formed on that member.

In the preferred embodiment shown in FIG. 2, a semirigid coaxial cable 40 of 0.047 inch nominal outer diameter and of 1.25 inch nominal length is electrically connected at its rearward end to the K-connector 30. Referring also to FIG. 4, this coaxial cable includes a copper inner conductor 41, an air-expanded Teflon™ inner dielectric 42 (for maximum temperature stability) and a copper outer conductor 43 and is preferably of phase-stable, low-loss type. One suitable type of cable, for example, is available from Micro-coax Components Inc. of Collegeville, Pa. under model number UT-47-LL.

Referring to FIGS. 2 and 4 together, the forward end 48 of the cable 40 remains freely suspended and, in this condition, serves as a movable support for the probing end 31 of the probe. Before being connected to the K-connector 30, the cable is bent along first and second intermediate portions 44 and 45 in the manner shown in FIG. 2 so that an upwardly curving 90° bend and a downwardly curving 23° bend, respectively, are formed in the cable. Also prior to its connection to the K-connector, a semicylindrical recess 46 is formed in the cable adjacent its forward end 48 as shown in FIG. 4. This recess is formed by making a longitudinal cut of about 28 mil depth 50 (FIG. 5b) through the cable and by making a transverse cut of about 21.5 mil depth 52 (FIG. 6) at the end of the longitudinal cut. In accordance with this procedure, a semicylindrical portion of the outer conductor 43, the inner dielectric 42 and the inner conductor 41 are removed, as best shown in FIGS. 4 and 6, so that the remaining portions of these elements together form a flat shelf 60 (FIG. 5b) that extends to the forward end of the cable as well as a back face 62 (FIG. 6) that extends crosswise in relation to the length of the cable.

To prepare the rearward end of the cable 40 for connection to the K-connector 30, the rearward end is stripped to expose the adjacent inner conductor, and this inner conductor is temporarily held inside a dummy connector while the adjacent outer conductor is soldered within a bore 64 formed in the primary support block 32. A recess 66 that is formed in the block below this bore provides access to facilitate the soldering process. The dummy connector is then removed and the K-connector 30 is screwably installed in a threaded opening 68 that is formed on the block above the bore so as to effect electrical connection between such connector and the coaxial cable 40. Preferably, Locktite 242™ is applied to the threads of the K-connector prior to its installation to ensure a tight physical connection.

Referring to FIG. 4, at the probing end 31 of the exemplary probe 20, an inner conductive finger 70 is connected to the inner conductor 41 of the cable and a pair of outer conductive fingers 72a and 72b are connected to the adjacent outer conductor 43 so as to form a ground-signal-ground conductor configuration. Referring also to FIG. 5d, which shows a bottom view of the probing end 31, each respective finger includes a cantilevered portion 74 that extends past the forward end 48 of the cable. The cantilevered portions are arranged in transversely spaced apart relationship to each other so as to cooperatively form a controlled impedance transmission line in order that a low-loss transition can be made between the respective conductors 41 and 43 on the cable and the respective pads on the device-under-test.

To a certain extent, the spacing between the respective fingers 70, 72a and 72b is determined by the geometry of the device pads and the cable. For example, referring to FIGS. 5d and 7 together, in relation to the distal ends of the respective fingers, the pitch or centerline-to-centerline spacing 76 between adjacent pairs of the fingers is selected in order to match the pitch of the pads on the device-under-test. In the preferred embodiment shown, each adjacent pair of fingers at the distal ends thereof is set apart at a pitch 76 of 6 mils in order to match the 6 mil pitch of 2 mil square pads on a device-under-test. (It is also customary for the pad-to-pad pitch to be set at other values such as 4, 5, 8 or 10 mils.) On the other hand, proximate the back face 62 of the cable, the pitch 77 between adjacent fingers is about 19 mils to correspond with the pitch between the exposed face of the inner conductor 41 and each adjacent exposed face of the outer conductor 43 of the cable.

Aside from the dimensions just mentioned, the principal criteria used in selecting the respective dimensions and relative spacing of the fingers 70, 72a and 72b is the desired establishment of a low-loss transmission line between the respective conductors 41 and 43 on the cable and the respective pads on the device-under-test. Thus, the inner finger 70 is arranged in a centered and coplanar position with respect to the pair of outer fingers 72a and 72b so as to form a balanced coplanar transmission line. Moreover, the dimensions of each finger and the spacing between the respective fingers is selected so that in relation to the cantilevered portions 74 of the fingers, corresponding sections will have the same characteristic impedance whether, for example, they are proximate to the forward end 48 of the cable or, instead, in distal relationship to this end. For the preferred embodiment shown, this uniform characteristic impedance is 50 ohms, which was selected to match the impedance presented at the pads of the device-under-test. In accordance with this finger arrangement, the probing end 31 of the probe is configured suitably for low-loss measurement of standard components at microwave frequencies.

In the preferred embodiment shown in FIG. 7, in relation to the distal ends of the fingers, the width 78 of each finger is set at 2 mils and the thickness 80 of each finger is set at 3 mils. These two dimensions are selected to provide a characteristic impedance of 50 ohms for the given pitch 76 of 6 mils and also to optimize the deflection characteristics of the fingers, each of which are made of resilient material to enable the probing of non-planar conductive surfaces. This aspect is further described hereinbelow.

It will be noted that the specific dimensions given above can be varied to suit the particular probing application. Thus, referring to FIG. 8, a finger arrangement corresponding to that of FIG. 7 is shown except that only two fingers 81a and 81b are provided to enable the probing of a signal-ground device pad arrangement, and the thickness 82 of each finger in FIG. 8 has been increased to 5 mils from the 3 mil thickness shown in FIG. 7 in order to keep the characteristic impedance of the two-conductor line of FIG. 8 at 50 ohms.

In order to minimize insertion loss over the transition region represented by the respective fingers 70, 72a and 72b, the proper transverse spacing between the fingers (i.e., as needed to provide a controlled impedance along the fingers) must be established during connection of these fingers to the corresponding conductors 41 and 43 of the cable. Referring to FIG. 5c, in accordance with a preferred method of the present invention, the proper transverse spacing is first established between the fingers 70, 72a and 72b not during connection of these fingers to the cable but previous to such connection while forming these fingers on a single conductive member 86. In particular, the fingers are formed so that each has opposite first and second end portions 88 and 90, respectively, where the first end portions are integrally interconnected together by a carrier strip 92 included on the conductive member. This carrier strip serves to maintain the proper transverse spacing between the fingers during connection of these fingers to the cable.

In the preferred embodiment shown, the conductive member 86 is fabricated using an electrical discharge machining (EDM) process so that the respective conductive surfaces of the fingers 70, 72a and 72b are free of roughness or other irregularities and so that the relative dimensions of the fingers can be carefully controlled. Alternatively, other fabrication processes can be used, such as micro-machining, photolithography and etching.

In accordance with a preferred assembly method, to prepare for connection of the respective fingers 70, 72a and 72b to the cable, solder paste is evenly applied over the exposed face of the inner conductor 41 and the exposed faces of the outer conductor 43. The fingers are then held just above the corresponding conductors so that the inner conductive finger 70 is in centered position relative to the inner conductor 41 of the cable and so that the second end portions 90 of the fingers extend approximately halfway along the exposed portions of the corresponding conductors in respective positions that are approximately flush with the imaginary alignment line 94 shown in FIG. 5c. The fingers are then lowered until they just touch the individual balls formed by the solder paste, and the second end portions are then slid toward the back face 62 on the cable to the position shown in FIG. 5c. In accordance with this procedure, when the solder is then melted, preferably by heating elements that are arranged above and below the connection region, a solder fillet is desirably formed at the back of each finger between the second end portion and the corresponding cable conductor.

Preferably, while heating the solder, the first end portions 88 of the fingers are held at a slight downward incline relative to the second end portions 90 so that during cooling, each finger assumes a planar relationship relative to the longitudinal axis of the cable 40, as shown in FIG. 6, despite a slight contraction of the Teflon™ dielectric 42 during cooling. During this connection process, it will be noted that the proper transverse spacing is maintained between the respective fingers by the carrier strip 92, since any forces present during connection that would tend to laterally displace these fingers are counteracted by the strip which holds the first end portions 88 of the fingers firmly in place. Referring to FIGS. 5c and 5d together, after the step of connecting the fingers to the cable is completed, the first end portions of the fingers are trimmed so as to remove the carrier strip 92 and so as to electrically isolate the respective fingers from each other.

It will be noted in FIG. 5d that the supported portions 96 of the respective fingers 70, 72a and 72b, like the cantilevered portions 74 of the same fingers, are arranged relative to each other to provide a desired transmission characteristic at each section along these portions. For example, proximate the back end of the supported portions, the spacing between the fingers rearwardly tapers outwardly so as to form respective corner edges 98 along these portions. These corner edges, due to a fringing effect, serve as a transition for the non-coplanar components of the electrical field that travel across the back face 62 of the cable between the shielded portion of the cable and the fingers. Along this section of the supported portions 96, then, a suitable conductor arrangement is provided for effecting a low-loss transition between non-coplanar and coplanar fields.

Just forwardly of the corner edges 98 on the fingers, the spacing 102 between each adjacent pair of fingers is about 4 mils, which spacing gradually decreases forwardly to a minimum spacing 103 between the fingers of about 2 mils. Referring also FIG. 5c, it will be noted that the area of the supported portion 96 of each finger is slightly oversized in relation to the corresponding conductor 41 or 43. This is done not only to provide a better impedance match between the cable conductors and the fingers, but also to accommodate manufacturing tolerances whereby certain dimensions of the coaxial cable are permitted to vary from their nominal values. The outer diameter 104 of the cable, for example, can vary from its nominal value of 47 mils by as much ±2 mils. Referring to FIG. 6, it will be noted that the substantially in-line position of each finger in relation to the inner conductor 41 of the cable is not affected by tolerance variations in the outer diameter 104 of the cable. Such would not be the case, for example, were the fingers to be based on a support that was then attached to the outer conductor 43 in accordance with certain conventional designs.

As described hereinabove, in forming the flat shelf 60 on the forward end 48 of the cable, a semi-cylindrical portion of the inner conductor 41 is removed to form a flat face 105 on the inner conductor itself. Not only does this enable the inner finger 70 to be mounted substantially in-line with the inner conductor, as just described, but this also ensures that a face-to-face joint is created between the supported portion 96 of each finger and the corresponding conductor 41 or 43 so that a rugged and physically strong connection is formed therebetween. At the same time, the flat shelf 60 facilitates rework or replacement of the fingers should any one of the fingers become damaged, that is, a new set of fingers can rapidly be installed in place of the old set.

In accordance with the invention, each conductive finger 70, 72a and 72b is formed of the same material, where this material is selected from those metals that are capable of high resiliency or springiness to enable the fingers to probe a device having associated contact surfaces that are in non-planar arrangement. In the preferred embodiment shown in FIG. 5d, the fingers are formed from beryllium copper (BeCu) which has been gold-plated in order to reduce resistive losses. This material is particularly well-suited for the probing of contact pads that are formed of gold, since BeCu is substantially harder than gold. This, in turn, results in minimal wearing of the fingers and a long maintenance-free period of probe operation. On the other hand, if the pads of the device are formed of aluminum instead of gold, it is preferable to use a harder material for the fingers, such as tungsten. Here again the finger material selected is substantially harder than the contact pad material in order to ensure minimal wearing of the fingers. If tungsten fingers are used, it is preferable that they be gold-plated like the BeCu fingers to reduce resistive losses.

Referring to FIGS. 2, 4 and 6 together, it will be recognized that another advantage of the flat shelf 60 formed adjacent the cable end 48 is that this shelf enables each resilient finger 70, 72a and 72b to be mounted along this end so that each finger is similarly oriented with respect to the corresponding pad 106 of the device-under-test, that is, each will have the same angle of approach 107 (FIG. 10) in relation to its corresponding pad. This like orientation between each finger and its corresponding pad, in conjunction with the like material composition of each finger and the like cross-sectional area of corresponding sections of the fingers, ensures that each finger has substantially the same deflection characteristic and that the respective fingers engage their corresponding pads with a uniform contact pressure. Accordingly, even wearing of the pads and of the fingers will occur regardless of the level of contacting pressure reached during each contact cycle. Should one of the fingers become slightly bent in a vertical direction relative to the other fingers, so as to be positioned slightly out-of-alignment with those other fingers, this condition can be readily detected by viewing the ends of the fingers. As indicated in FIG. 7, due to the rectangular cross-section of each finger, any vertical misalignment between one finger and another will be readily apparent since, in accordance with this condition, the lower faces 116 of the respective fingers will fail to line up with each other.

As mentioned above, the width 78 and the thickness 80 of each finger 70, 72a and 72b are preferably selected not only to provide a characteristic impedance of 50 ohms but also to optimize the deflection characteristics of the fingers. In particular, the width/thickness ratio of the fingers is selected so that corresponding sections of the fingers are substantially equal in cross-sectional area so as to facilitate equal wearing of the fingers and so that the contacting force applied by the fingers is substantially uniform for each finger. With respect, generally, to the cantilevered portions 74 of the fingers, the width/thickness ratio is selected so as to obtain a characteristic impedance of 50 ohms at each section along these portions, as has been previously described. More particularly, at the distal ends of these fingers, the width 78 is smaller than the thickness 80, as indicated in FIG. 7. This relationship helps to ensure that when the distal ends of the fingers are being flexed, this flexing is not limited to a localized region proximate only to such ends but rather is more broadly distributed over the entire length of the cantilevered portions 74 of the fingers so that the stresses which arise internally within the fingers during such flexing are more evenly distributed therealong. On the other hand, referring also to FIGS. 4 and 5d, with respect to those portions of the fingers proximate to the back face 62 of the cable, the inverse relationship holds, that is, here the width of each finger is larger than its thickness. This not only serves to provide the desired transmission characteristic along the supported portions 96 of the fingers, as described above, but also serves to maximize the area of connection between each finger and the corresponding conductor 41 or 43 so that a relatively strong connection joint is formed therebetween.

With respect to their lengthwise dimension, the respective fingers 70, 72a and 72b are relatively short. In the preferred embodiment shown in FIG. 5d, for example, the end-to-end length 110 of each finger is set at less than 65 mils. Although there is some trade-off between finger flexibility and length, the fingers are kept relatively short to minimize the length of the transition region between the cable and the device pads so that minimal insertion loss is achieved.

Referring to FIGS. 4, 5d and 6 together, the cantilevered portion 74 of each finger 70, 72a and 72b is self-supporting. In effect, the air surrounding the cantilevered portions of the fingers serves as the dielectric for the transmission line formed by these portions. In accordance with this design, the flexing portion of each finger is unsupported by any other member including by any dielectric member. As a result, these portions are able to be flexed over numerous contact cycles without fatiguing any adjoining dielectric members of relatively stiff composition and without causing any change in the transmission characteristics of the air dielectric that surrounds these portions. The probing end 31 of the exemplary probe can be therefore used numerous times without any significant degradation in the electrical performance of the probe.

Referring to FIGS. 5c, 5d and 6 together, after the carrier strip 92 has been trimmed away from the distal ends of the fingers, then when viewed from the side, these ends have a substantially rectangular profile, as defined by an upper face 112, an end face 114 and a lower face 116 on each finger. In accordance with a preferred method of making the present invention, these ends are further shaped so that their profile is better suited for the probing of device pads or surfaces.

Referring to FIG. 9a, in accordance with a preferred method of shaping the distal ends 118 on the fingers, the fingers are held so that their lower faces 116 extend at a 45° angle 120 with respect to the horizontal. Using a vertical grinding surface, triangular-shaped portions 122 on the ends are then removed until a flat rectangular end face 124 appears on each end directly between the corresponding upper and lower faces 112 and 116. Preferably, a diamond grinding wheel is used for forming the rectangular end faces in order to give these faces a mirror-like finish.

Before continuing with the next shaping step, preferably, a rigid support block 126 that has been formed of microwave-absorbing material is mounted on the underside of the primary support block 32 as shown in FIG. 2. This rigid block includes a rounded fulcrum portion 128 that is positioned immediately adjacent the first intermediate portion 44 on the coaxial cable 40 so that the deflection characteristic of the cable is relatively well-defined when the forward end 48 of the cable is urged into movement by contact forces acting on the probing end 31. The rigid support block further includes a generally U-shaped downwardly-facing channel portion 130, the inside surface of which interferingly limits the upper range of deflection of the cable so that the cable is not bent beyond its range of resilient action when excessive contact forces act on the probing end 31. In the preferred embodiment shown, the microwave-absorbing material used to form the block is made from iron as well as other constituents and is available from Resins Systems Corporation based in Amherst, N.H. under model number RS-4700.

After the rigid support block 126 has been installed, the distal ends 118 of the fingers are preferably parallel lapped, as indicated in FIG. 9b, so that a second triangular-shaped portion 132 is simultaneously removed from each end. With respect to the preferred embodiment shown in the drawings, in preparation for this lapping step, the angle 136 between the lower face 116 of each finger and the horizontal is readjusted from the 45° tilt shown in FIG. 9a to a 23° tilt as shown in FIG. 9b. The probing end 31 is then lowered until the forward corner 133 of each triangular-shaped portion 132 just touches the surface of a diamond film-coated substrate. Referring also to FIG. 2, beginning from this position, the primary support block 32 is moved an additional 4 mils closer to the diamond film-coated substrate so as to develop large contact forces between the fingers and the substrate, and the distal ends 118 of the fingers are then dragged back across the diamond film coating so as to lap off each triangular-shaped portion 132. In accordance with this procedure, a flat contacting face 134 is formed on each end, which contacting face is contiguous with the corresponding lower face 116 and which, in conjunction with this lower face, establishes a predetermined angle of engagement for the fingers that corresponds to angle 136. Since the angle 136 is held at 23° during the procedure, the angle of engagement for the fingers is correspondingly set at the same angle. It will further be noted that the flat end face 124 on each finger is held at a 22° angle 140 relative to the vertical during the procedure, the significance of which is described hereinbelow.

In accordance with the fabrication step just described, a sharp lower corner 142 is formed on each finger between the end face 124 and the contacting face 134. However, if this sharp corner is left on each end, there is a risk that one or more of these corners will chisel under the surface of the device pads when these ends are wiped across the pads to remove, for example, surface oxides from the pads. To eliminate this risk, a third triangular-shaped portion 144 is preferably removed from the ends in order to blunt the ends as shown in FIG. 9c. This step can be performed by parallel lapping the ends across a diamond film-coated substrate using an approach similar to that which was just described.

Referring again to FIG. 2, in accordance with the concluding steps of the preferred method of assembling the exemplary probe, the bottom of the rigid support block 126 is covered with a soft and flexible sheet 146 formed of microwave-absorbing material so as to provide a cushioning layer along the bottom of that block. An example of material of suitable type for this purpose is a filled silicon rubber product containing iron constituents that is available from Emerson & Cumings, Inc. based in Canton, Mass. under the model name GDS. A tube 148 of semi-flexible microwave-absorbing material is then slidably inserted over the protruding end of the coaxial cable 40 so as to lie flush with the back face 62 on the cable. As shown in FIG. 2, this tube is tapered along the end thereof that sits flush with the back face 62 in order to avoid interference between the tube and the device-under-test. In the preferred embodiment shown, the material used for forming the tube is composed of iron, urethane and other constituents and is available from Resins Systems Corporation under model number RS-4700 UF. The microwave-absorbing components on the exemplary probe, that is, the rigid support block 126, the flexible sheet 146 and the semi-flexible tube 148, cooperatively serve to substantially reduce the levels of microwave energy that travel along the outer conductor 43 of the semirigid cable 40 and other exterior probe structures. Hence, very little noise is able to couple into the primary signal path even when, as is typically the case, the device-under-test is situated in a relatively noisy environment. Conversely, very little leakage or externally-induced radiation is able to propagate along the probe surfaces and cause electrical disturbance at the device-under-test.

Referring to FIG. 10, it will be recognized that the flat contacting face 134 formed on the distal end 118 of each finger directly serves as the contacting member for the entire finger, that is, it is this face that is pressably engaged directly against the corresponding pad 106 of the device-under-test when the contact cycle is initiated. Because the contacting face or member of each finger is integrally formed on the finger, even after long use of the probe, there is virtually no risk that this member will break away from or otherwise separate from the remainder of the finger. Furthermore, because each contacting member constitutes a flat face 134 instead of a point or corner edge, the contact pressure that is developed between each finger and the corresponding pad during each contact cycle is more widely distributed than it would otherwise be, hence reducing the likelihood of nicks or other surface damage occurring to the pads or fingers.

Since the flat contacting faces 134 on the respective fingers are simultaneously formed by a parallel lapping process, these contacting faces or members are arranged in substantially coplanar relationship with each other in the absence of any external forces acting on the fingers. Because of this relationship, when the probe 20 is moved sufficiently close to the device-under-test as to initiate contact between its probing end 31 and the pads of the device, each contacting face 134 comes into contact with its pad 106 at substantially the same instant. This is indicated in FIG. 10 which shows how the fingers 70, 72a and 72b are aligned one directly behind the other just after the probing end has made initial contact with the pads 60 of the device. Due also to the aforedescribed equivalency in the material composition, cross-sectional geometry and spatial orientation of the fingers, the fingers each possess a substantially uniform deflection characteristic. Therefore, as the vertical spacing between the probe and the device-under-test is reduced even further and as each finger begins to flex in a manner somewhat analogous to a cantilevered beam, the rate of flexure and the profile of flexure is substantially identical for each finger. This relationship is indicated in FIG. 10 by dashed line 150 which represents the flexure profile for the end of each finger after the vertical spacing between the probe and the device-under-test is further reduced beyond that where contact was initiated. FIG. 11 shows a fragmentary view of the inner finger 70 and the outer finger 72a as seen from above while these fingers are positioned in the manner of FIG. 10. Referring to FIGS. 10 and 11 together, it will be recognized that the transverse spacing 152 between corresponding pairs of sections of the fingers will remain substantially constant regardless of how much contact pressure distributively acts on each corresponding pair since each member of the pair will respond substantially equally to the particular component of contact pressure acting on the pair and will therefore deflect substantially the same amount. Accordingly, throughout the period of any particular contact cycle and independently of the maximum level of contact pressure reached during the cycle, a constant characteristic impedance is maintained between corresponding sections of the fingers and the overall transmission characteristic along the fingers remains stable. This, in turn, minimizes the insertion loss that occurs during actual probing along the transition region represented by the fingers.

The ratio of finger stiffness to cable stiffness is preferably selected so that each of the fingers 70, 72a and 72b need to first be brought into pressing engagement with the corresponding pads of the device-under-test before any bending of the semirigid cable 40 will occur even when, for example, the pads or other contacting surfaces on the device present a non-planar surface arrangement such as of the type shown in FIG. 12 or 13. This ensures that each finger will have the opportunity to engage its corresponding pad before the cable starts to bend in a manner that limits further increases in contact pressure. After each finger has been brought into pressing engagement with its corresponding pad, as in the manner depicted in FIG. 2, if the vertical spacing 151 between the probe 20 and the device-under-test is then reduced even further, as in the manner depicted in FIG. 3, the coaxial cable 40 will bend in relation to the rigid support block 126 about the fulcrum portion 128 of the block, and each finger will accordingly wipe across the surface of the corresponding contact pad 106, as indicated. This wiping process desirably removes the surface oxides on each pad so that low-loss electrical connection is reliably established between these pads and the fingers.

In FIG. 3, the contacting pressure between the pads and the fingers has become sufficiently great as to cause the cable 40 to "bottom out" against the upper inner surface of the channel portion 130 as formed on the support block 126. Alternatively, if the wafer 24 extends beneath the cushioning layer formed by the microwave-absorbing sheet 146, then the sheet will bottom out against the wafer so as to prevent further upward bending of the cable even before the cable has engaged the upper inner surface of the channel portion 130. In any event, either the channel portion 130 or the cushioning sheet 146 serve to limit the deflection of the coaxial cable to within the maximum range of resilient bending action for the cable. Accordingly, after probing is complete, when the probing end 31 is lifted off the pads by movement of the probe and the device-under-test vertically away from each other, the coaxial cable automatically returns to its original position.

In the enlarged view of FIG. 11, the pads therein shown are intended to represent pads that are 2 mil square and that are set apart by a center-to-center line spacing of 6 mils. In other words, the edge-to-edge spacing 154 between the pads is 4 mils. In conformance with this pad spacing, at their distal ends, the edge-to-edge transverse spacing 152 between the fingers is set at 4 mils while, as previously described, the width 78 of each finger is set at 2 mils. It will be noted in accordance with the given dimensions that the transverse spacing 152 between each adjacent pair of fingers is sufficiently large that any loose particles which have collected either on or adjacent the device-under-test are not likely to become trapped between the fingers. In any event, this transverse spacing is large enough to facilitate easy cleaning between the fingers should these fingers become clogged with any debris. This is even less of a problem when the transverse spacing between the fingers is increased in order to conform to larger pad spacings.

Referring to FIG. 9b, as was previously noted, the end face 124 formed on the distal end 118 of each finger is inclined rearwardly from the vertical at an angle 140 of 22° when the flat contacting face 134 is aligned with the horizontal. Accordingly, referring also to FIG. 10, the end face 124 extends at an obtuse interior angle 156 of 135° in relation to the upper face 112. Furthermore, as was previously described, the end face 124 is formed in such a manner as to possess a mirror-like finish. Thus, when the operator looks down on the fingers, the operator will observe a dark line 158 extending across the extreme end of each finger as indicated by crosshatched lines in FIG. 11. This occurs because each end face 124, due to its rearwardly-inclined orientation, reflects the dark background shade lying ahead of it when viewed from directly above in accordance with a visual path of the type schematically indicated in FIG. 10 by dashed line 160. These dark lines enable the operator to readily distinguish between the gold surfaces of the fingers and the gold surfaces of the pads so that the operator can readily determine visually just exactly where the fingers end and the pads begin. To describe it yet another way, the dark line 158 on each finger sharply contrasts with the seemingly light coloration of the pads and therefore provides the operator with a highly visible indicator mark for determining the position of each finger relative to its pad.

Referring to FIG. 11, due to the relatively large air gap 152 provided between the fingers, it is relatively easy to locate the position of the pads while aligning the fingers relative to these pads. If, for example, the fingers are not transversely centered on the pads, a portion of each pad will be visible directly opposite one end of the dark line 158 on each finger, which serves as a clear indication to the operator that further alignment is needed. Thus, rapid completion of the tip positioning procedure is facilitated.

FIGS. 12 and 13 illustrate how the resilient conductive fingers 70, 72a and 72b are able to flex independently of each other to permit the probing of non-planar device surfaces. With respect to FIG. 12, the plane of the wafer 24 that supports the device-under-test is out of parallel alignment with the plane of the contacting faces 134 of the fingers, as defined when no external forces are acting on these fingers. The extent of this misalignment is characterized by the angle 162 in FIG. 12. To compensate for this misalignment, inner finger 70 flexes somewhat more than outer finger 72b, while outer finger 72a flexes somewhat more than inner finger 70. This causes the transverse spacing between the fingers to vary slightly from that which is optimal. However, this minor change in the transverse spacing has only a minor adverse effect on the level of insertion loss associated with the fingers.

FIG. 13 illustrates the type of non-planar probing condition that arises when a small conductive particle 164 adheres electrostatically to one of the pads 106a, 106b and 106c of the device-under-test. Equivalently, even if no particle is present, the height of the respective pads may differ from each other. In adapting to this type of condition, the inner resilient finger 70 flexes to a somewhat greater extent than the outer fingers 72a and 72b. As with the probing condition of FIG. 12, with respect to a probing condition of the type illustrated in FIG. 13, only a minor degree of adverse change occurs in the transverse spacing of the fingers and, hence, in the insertion loss associated with the fingers. Thus, this type of condition does not significantly impact adversely the electrical performance of the probe.

Although a preferred embodiment of a probe 20 and a preferred method of making this probe have now been shown and described, it will be recognized that variations in the construction of the probe are possible without departing significantly from the broader aspects of the present invention. Thus, the dimensions and relative spacing between the fingers of the probe can be adjusted to suit the particular application, and materials different than those above-described may be used depending on the application. Furthermore, the size of the coaxial cable 40 used can be different than that specified, although the relative stiffness of the cable and fingers is preferably selected to provide the desired skating characteristics, as hereinabove described. With respect further to the respective dimensions of the fingers and cable, these can be selected to provide a characteristic impedance of other than 50 ohms where another impedance would be desirable for low loss match to the system being measured.

In addition to the above modifications, the cable can be bent at angles different than those described or even a straight length of cable can be used in order to minimize cable loss. In this latter configuration, the end of the cable can be attached to an input connector that is mounted in angled relationship relative to the primary support block. Another alternative form of construction is to form the flat shelf on the cable by making a diagonal cut through a transverse section of the cable. Still another possible modification is to form the absorber block 126, or portions thereof, of metal and to integrate this block with the primary support block 32 in order to reduce manufacturing costs. In addition to those modifications just indicated, other modifications to the preferred embodiment are possible without departing from at least the broader aspects of the invention.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A probe tip assembly comprising:
   (a) a coaxial cable having an end and including an inner conductor, an outer conductor and an inner dielectric;
   (b) respective first and second resilient conductive fingers formed separately from and connected to said inner conductor and said outer conductor, respectively, each finger including a cantilevered portion extending past said end of said cable, said cantilevered portions of said fingers being arranged in transversely spaced apart relationship to each other so as to cooperatively form a controlled impedance transmission line; and
   (c) said cantilevered portion of each finger being self-supporting in a manner substantially unsupported by any dielectric material and having a contacting member thereon suitably disposed for selective pressing engagement against a corresponding contact pad of a device-under-test, said contacting members on said fingers being arranged in substantially coplanar relationship with each other in the absence of any external forces acting on said fingers.

2. The probe tip assembly of claim 1 wherein each finger is of substantially rectangular transverse cross-section.

3. The probe tip assembly of claim 1 wherein said cantilevered portions of said fingers are arranged in mutually coplanar relationship to each other in the absence of any external forces acting on said fingers.

4. The probe tip assembly of claim 1 wherein a semicylindrical recess is formed on said cable adjacent said end so as to provide a flat shelf on said cable extending to said end and each finger includes a supported portion connected along said flat shelf.

5. The probe tip assembly of claim 1, further including a support block, said cable being mounted on said support block in cantilevered relationship thereto, said cable being of semirigid type so that when sufficient forces act on said fingers, said cable bends in relation to said support block to enable each finger to wipe across the corresponding said contact pad.

6. The probe tip assembly of claim 1 wherein said assembly includes a third resilient conductive finger having a cantilevered portion and connected to said outer conductor in such a manner that said cantilevered portion of said first resilient conductive finger is in spaced apart centered relationship between said cantilevered portions of said second and third resilient conductive fingers.

7. The probe tip assembly of claim 1 wherein the transverse spacing between said cantilevered portions as measured between any pair of corresponding sections thereof is of substantially constant amount despite flexing of said fingers from respective rest positions wherein the corresponding said contacting members are spaced apart from a coplanar group of contact pads to respective deflected positions wherein said contacting members are in pressing engagement against the corresponding contact pads of said coplanar group.

8. The probe tip assembly of claim 1 wherein each finger includes a reflective face arranged so that when the corresponding contacting member is in contact with a pad on said device-under-test, said reflective face reflects back a portion of said device lying ahead of said pad to a user looking down on said finger.

9. The probe tip assembly of claim 1 wherein said contacting member is integrally formed on each finger.

10. The probe tip assembly of claim 9 wherein said contacting member is a lower flat surface on each finger.

11. The probe tip assembly of claim 1 wherein said cantilevered portion of each finger has an upper face and a flat inclined face so arranged in relation to each other that said flat inclined face extends at a predetermined obtuse interior angle relative to said upper face.

12. The probe tip assembly of claim 11 wherein said inclined face is located on each finger along an end thereof distal to said end of said cable.

13. A probe tip assembly comprising:
   (a) a coaxial cable having an end and including an inner conductor, an outer conductor and an inner dielectric;
   (b) respective first and second conductive fingers formed separately from and connected to said inner conductor and said outer conductor, respectively, each finger including a cantilevered portion extending past said end of said cable, said cantilevered portions of said fingers being arranged in transversely spaced relationship to each other; and
   (c) a semicylindrical recess being formed on said cable adjacent said end so as to provide a flat shelf on said cable extending to said end, each finger including a supported portion connected along said flat shelf.

14. The probe tip assembly of claim 13 wherein said flat shelf is partially defined by a flat face formed on said center conductor, said first finger being connected along said flat face.

15. The probe tip assembly of claim 13 wherein said cantilevered portion of each finger is self-supporting in a manner substantially unsupported by any dielectric material.

* * * * *